United States Patent
Wu et al.

(10) Patent No.: US 7,495,967 B2
(45) Date of Patent: Feb. 24, 2009

(54) METHOD OF IDENTIFYING LOGICAL INFORMATION IN A PROGRAMMING AND ERASING CELL BY ON-SIDE READING SCHEME

(75) Inventors: Chao-I Wu, Tainan (TW); Ming-Hsiu Lee, Hsinchu (TW); Tzu-Hsuan Hsu, Zhong-Pu Shiang (TW)

(73) Assignee: Macronix International Co., Ltd., Hsinchu (TW)

( * ) Notice: Subject to any disclaimer, the term of this patent is extended or adjusted under 35 U.S.C. 154(b) by 81 days.

(21) Appl. No.: 11/601,710

(22) Filed: Nov. 20, 2006

(65) Prior Publication Data

US 2008/0084762 A1    Apr. 10, 2008

Related U.S. Application Data

(63) Continuation of application No. 10/873,623, filed on Jun. 23, 2004, now Pat. No. 7,139,200.

(51) Int. Cl.
*G11C 11/34* (2006.01)
(52) U.S. Cl. .............................. 365/185.29; 365/185.28; 257/324
(58) Field of Classification Search ............ 365/185.29, 365/185.28; 257/324
See application file for complete search history.

(56) References Cited

U.S. PATENT DOCUMENTS

| | | | |
|---|---|---|---|
| 5,982,669 A | 11/1999 | Kalnitsky et al. | |
| 6,011,725 A | 1/2000 | Eitan et al. | |
| 6,643,170 B2* | 11/2003 | Huang et al. | 365/185.03 |
| 6,768,165 B1* | 7/2004 | Eitan | 257/324 |
| 2004/0190341 A1 | 9/2004 | Shappir | |

* cited by examiner

*Primary Examiner*—Richard Elms
*Assistant Examiner*—Nam Nguyen
(74) *Attorney, Agent, or Firm*—Rabin & Berdo, PC

(57) ABSTRACT

A method of identifying logical information in a cell, particularly in a programming by hot hole injection nitride electron storage (PHINES) cell by one-side reading scheme is disclosed. The method comprise steps of: erasing the first region and the second region of PHINES cell by increasing a local threshold voltage (Vt) to a certain value; programming at least one of the first region and the second region of the PHINES cell by hot hole injection; and reading a logical state of the PHINES cell by measuring an output current of one of the first region and the second region; wherein different quantity of the output current is caused by interaction between different quantity of the hot hole stored in the first region and the second region, so as to determine the logical state of the PHINES cell by one-side reading scheme.

11 Claims, 9 Drawing Sheets

METHOD OF IDENTIFYING LOGICAL INFORMATION IN A PROGRAMMING AND ERASING CELL BY ON-SIDE READING SCHEME

CROSS-REFERENCE TO RELATED APPLICATION

This application is a continuation of application Ser. No. 10/873,623, filed Jun. 23, 2004 now U.S. Pat. No. 7,139,200, the entire disclosure of which is incorporated herein by reference.

BACKGROUND OF THE INVENTION

1. Field of the Invention

The invention relates in general to a method of identifying logical information in a programming and erasing cell by one-side reading scheme, and more particularly to the method of identifying logical information in a programming by hot hole injection nitride electron storage (PHINES) cell by one-side reading scheme.

2. Description of the Related Art

Semiconductor device, having the advantages that the information stored therein is not lost even the power supply is removed, so labeled as "non-volatile memory" is current widespread use today. The non-volatile semiconductor memory, such as read only memory (ROM), programmable read only memory (PROM), erasable programmable read only memory (EPROM), electrical erasable programmable read only memory (EEPROM) and flash EEPROM, are used in various application.

Semiconductor EEPROM device involves more complicate processing and testing procedures than other non-volatile semiconductor memory devices, but having the advantage of electrically storing and removing data. Using EEPROM devices in circuitry permits in-circuit erasing and reprogramming of the device. Flash EEPROM, similar to EEPROM, can be programmed and erased electrically but with additional ability of erasing memory cell at once. However, the manufacturing process of flash EEPROM is complicated and the production cost thereof is very expansive.

Many researches have been proposed, focusing on constructing a better memory cell based on the EEPROM model; for example, nitride read only memory (NROM) having high-density has been configured by modifying the traditional form of EEPROM cell. If the NROM device is programming (storing data into the device), a charge is injected and trapped in the charge-trapping layer. One significant characteristic of NROM is that a NROM cell is capable of storing two bits data. Both ends of the charge-trapping layer cane be programmed and erased as two individual bits. However, the NROM device has the problems such as high power consumption due to hot electron programming and read disturbance, which are potential issues for scaling ability.

Recently, a novel flash memory cell, similar to the structure of the NROM cell but meet the requirements of mass storage application, named "PHINES" (programming by hot hole injection nitride electron storage) is proposed. PHINES uses a nitride trapping storage cell structure, FN erase to raise the threshold voltage (Vt) and lower local Vt by hot hole injection.

FIG. 1 illustrates a sectional view of a two-bit PHINES cell. The PHINES cell comprises a substrate 12 (typically a P-type substrate), a source 14 and a drain 16 separated by the channel, and two buried PN junctions. The left PN junction is between the source 14 and the substrate 12, and the right PN junction is between the drain 16 and the substrate 12. Above the channel is an oxide-nitride-oxide (ONO) stack 17, comprising a silicon dioxide layer 18, a silicon nitrite layer 19 and a silicon dioxide layer 20. Also, a control gate 22 is formed over the ONO stack 17. The silicon dioxide layer 18 forms as an electrical isolation layer over the channel. The silicon nitrite layer 19 functions as a trapping storage layer. The silicon dioxide layer 20 electrically isolates the silicon nitride layer 19 and the control gate 22. The PHINES cell is capable of storing two bits of data. The dashed circles 24 and 26 represent a left-bit (L-bit) and a right-bit (R-bit), respectively. In the PHINES cell, the silicon nitride layer 19 serves as the memory retention layer.

FIG. 2A schematically shows the L-Bit and the R-Bit at erased state. FIG. 2B schematically shows the L-Bit at programmed state and the R-Bit at erased state. As shown in FIG. 2A, before programming the PHINES cell, the L-Bit and the R-Bit need to be erased by FN electron injection so as to achieving high Vt state. The program is done by lowering local Vt through edge band-to-band hot hole injection. As shown in FIG. 2B, the L-Bit is programmed by hot hole injection while the R-Bit is still in erased state, thus local Vt of L-Bit is lower than that of R-Bit.

FIG. 3A~FIG. 3H schematically show the state of erasing, programming and reading the PHINES cell and the related logical information of two bits. In FIG. 3A and FIG. 3E, the L-Bit and the R-Bit are at erased state. In FIG. 3B and FIG. 3F, the L-Bit is at programmed state and the R-Bit is at erased state. In FIG. 3C and FIG. 3G, the L-Bit is at erased state and the R-Bit is at programmed state. In FIG. 3D and FIG. 3H, the L-Bit and the R-Bit are at programmed state.

After applying a selected potential to the control gate, the L-Bit and the R-Bit are in erased state by electron injection, and the electrons are trapped in the silicon nitride layer 19, as shown in FIG. 3A. To read the R-Bit of the PHINES cell in the reverse direction, a selected read voltage (Vread) and a gate voltage (Vg) are applied to the source 14 and the control gate 22, respectively. Since the electrons are trapped in the silicon nitride layer 19, the logical information of the R-Bit of FIG. 3A is "0".

In FIG. 3A~FIG. 3D, the Vread is applied to the source 14 for reading the logical information of the R-Bit in the reverse direction. In FIG. 3E~3H, the Vread is applied to the drain 16 for reading the logical information of the L-Bit in the reverse direction. Noted that a much wider depletion region must be sustained in the case of reading in the reverse direction. Thus, Vread should be large enough to create an adequate depletion region (regions 32 in FIG. 3A~FIG. 3D, regions 34 in FIG. 3E~3H), thereby shielding the state of the bit close to the electrode (source 14 in FIG. 3A~FIG. 3D, drain 16 in FIG. 3E~3H) for being applied by Vread.

In the case of reading in the reverse direction, the logical information of the R-Bit is determined according to the electrons trapping condition occurring in the R-Bit, whether in the L-Bit or not. Thus, the logical information of the R-Bit is "0" for the states of FIG. 3A and FIG. 3B; the logical information of the R-Bit is "1" for the state of FIG. 3C and FIG. 3D. Similarly, the logical information of the L-Bit is "0" for the state of FIG. 3E and FIG. 3G, the logical information of the L-Bit is "1" for the state of FIG. 3F and FIG. 3H. Accordingly, the logical information combination of a two-bit PHINES cell is "0 and 0", "0 and 1", "1 and 0" and "1 and 1".

However, reading the PHINES cell in the reverse direction has the drawbacks, such as $2^{nd}$-bit effect (higher Vread applied for reading in the reverse direction) thereby limiting the sensing window and the scaling ability, and hole-enhance local-DIBL (drain induced barrier lowing) effect (FIG. 4).

FIG. 4 represents hole-enhance local-DIBL effect of the PHINES cell. It is assumed that only the L-Bit is programmed by hot hole injection while the R-Bit is unprogrammed. Curve (I) represents the relationship between Vt and programming time of L-Bit. Curve (II) represents the relationship between Vt and programming time of R-Bit. Although only the L-Bit is hot-hole programmed, the Vt of R-Bit is decreased from V1 (V1 in FIG. 4) to V12 when the Vt of L-Bit is decreased from V1 (V1 in FIG. 4) to V22. This situation is so-called as "hole-enhance local-DIBL effect", and has the issue of controlling the operation window.

SUMMARY OF THE INVENTION

It is therefore an object of the invention to provide a method of identifying logical information in a programming and erasing cell, particularly in a programming by hot hole injection nitride electron storage (PHINES) cell, by one-side reading scheme, thereby easing the limitation of $2^{nd}$-bit effect and hole-enhance local-DIBL effect, and controlling the operation window.

The invention achieves the objects by providing a method of identifying logical information in a programming by hot hole injection nitride electron storage (PHINES) cell by one-side reading, wherein the PHINES cell having a first region and a second region with a channel therebetween and having a gate above the channel but separate therefrom by an oxide-nitride-oxide gate dielectric layer, said method comprising steps of:

erasing the first region and the second region by increasing a local threshold voltage (Vt) to a certain value;

programming at least one of the first region and the second region of the PHINES cell by hot hole injection; and reading a logical state of the PHINES cell by measuring an output current of one of the first region and the second region.

Different quantity of the output current is caused by interaction between different quantity of the hot hole stored in the first region or the second region or both regions, and the logical state of the PHINES cell is determined by one-side reading scheme.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
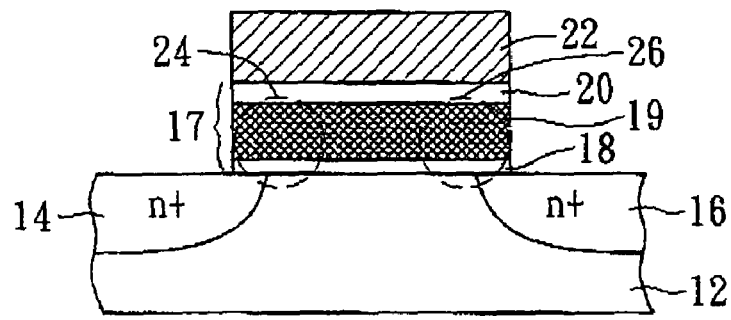
FIG. 1 (prior art) illustrates a sectional view of a two-bit PHINES cell.
Figure 2A:
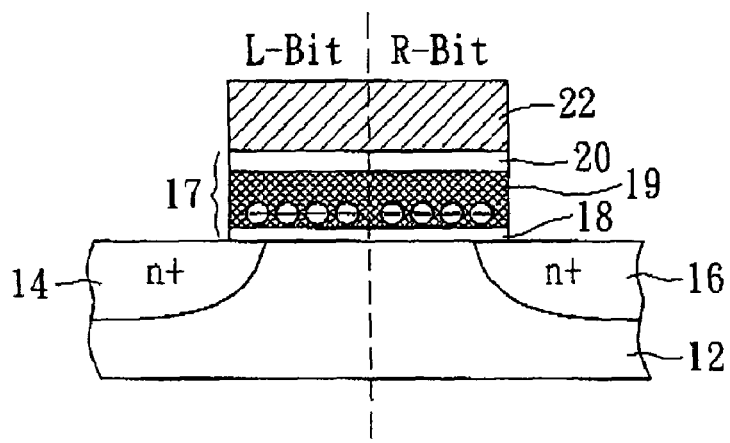
FIG. 2A (prior art) schematically shows the L-Bit and the R-Bit at erased state.
Figure 2B:
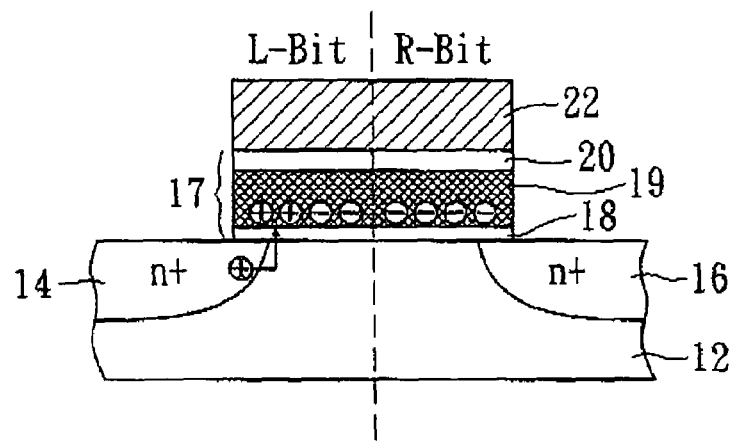
FIG. 2B (prior art) schematically shows the L-Bit at programmed state and the R-Bit at erased state.
Figure 3A:
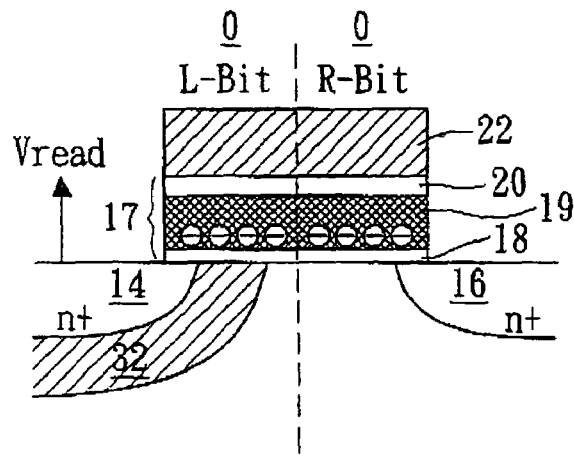
FIG. 3A~FIG. 3H (prior art) schematically show the state of erasing, programming and reading the PHINES cell and the related logical information of two bits.
Figure 3B:
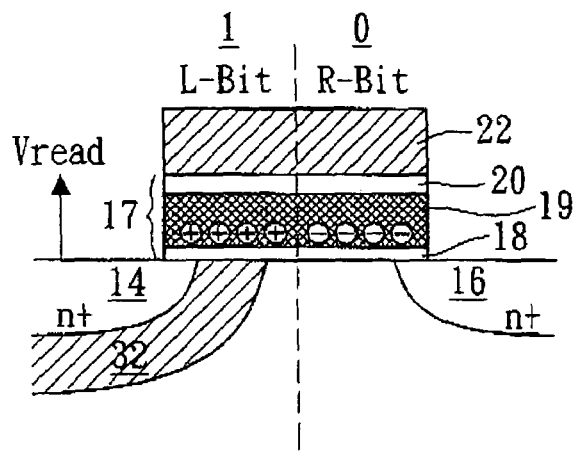
Figure 3C:
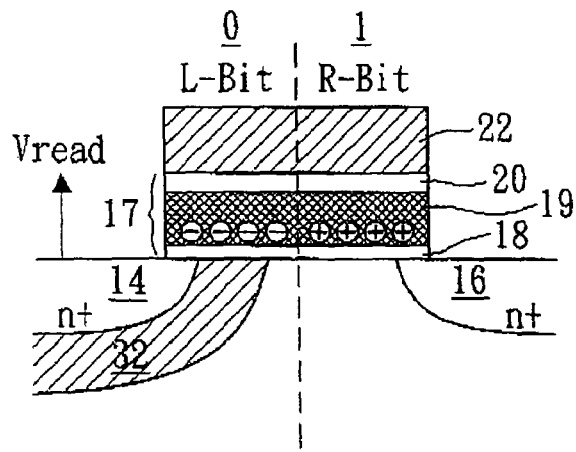
Figure 3D:
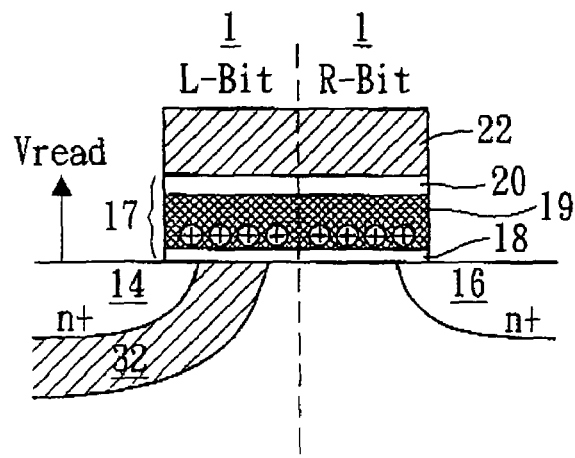
Figure 3E:
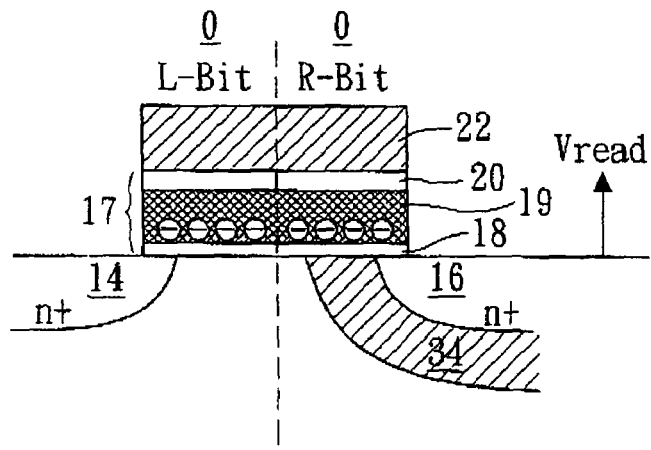
Figure 3F:
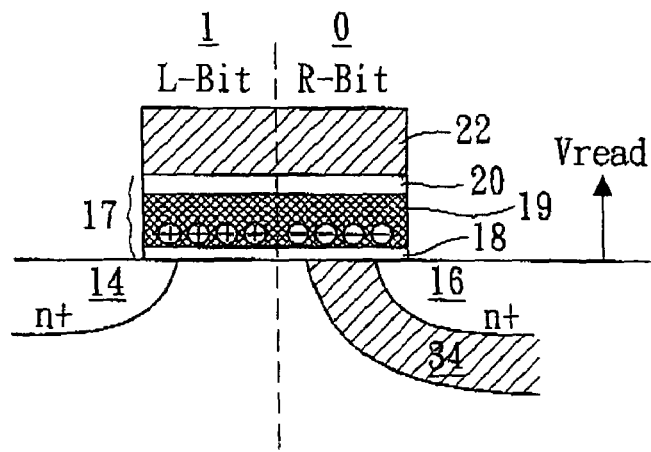
Figure 3G:
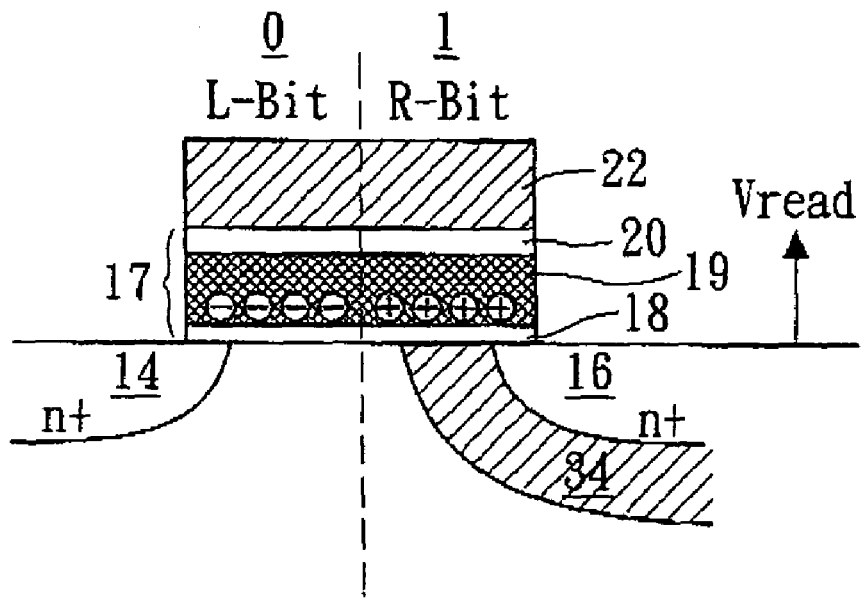
Figure 3H:
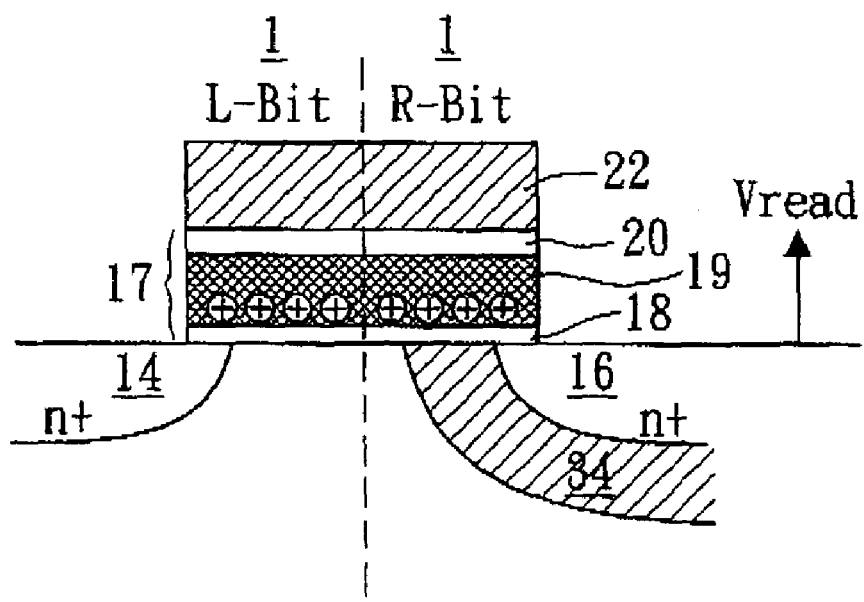
Figure 4:
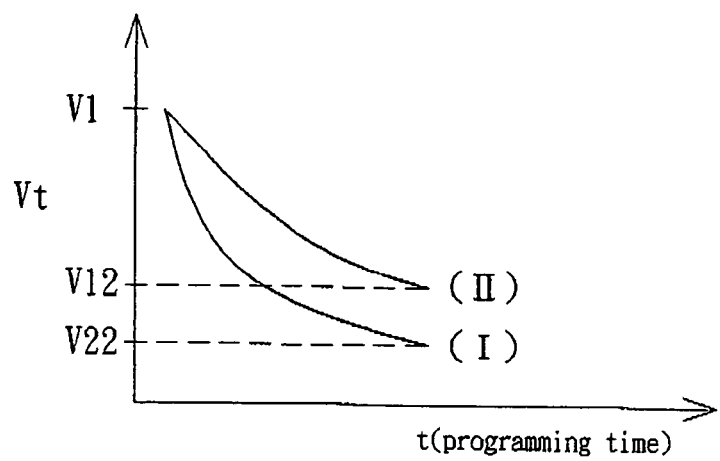
FIG. 4 (prior art) represents hole-enhance local-DIBL effect of the PHINES cell.

In the present invention, one-side reading scheme is utilized for identifying the local information in a programming and erasing cell, particularly in a programming by hot hole injection nitride electron storage (PHINES) cell. According to the embodiments, the PHINES cell could be one-side programmed (programming one bit) or two-side programmed (programming two bits), and different quantity of the hot hole stored in the first region and the second regions causes the different quantity of the output current by which the logical information of multi-bit of the PHINES cell is determined.

In the first embodiment of the invention, a PHINES cell with one-side hot hole program is used for illustrating the one-side reading scheme. In the second embodiment of the invention, a PHINES cell with two-side hot hole program is used for illustrating the one-side reading scheme. Also, the embodiments disclosed herein are for illustrating the invention, but not for limiting the scope of the invention. Additionally, the drawings used for illustrating the embodiments of the invention only show the major characteristic parts in order to avoid obscuring the invention. Accordingly, the specification and the drawing are to be regard as an illustrative sense rather than a restrictive sense.

One-side Hot Hole Programming and One-side Reading Scheme

FIG. 5A~FIG. 5D schematically show the state of erasing, programming and reading the PHINES cell and the related logical information of two bits according to the first embodiment of the invention. Please also refer FIG. 1 for the structure of a PHINES cell.

The PHINES cell comprises a substrate 12 (typically a P-type substrate), a source 14 and a drain 16 separated by the channel, and two buried PN junctions. The left PN junction is between the source 14 and the substrate 12, and the right PN junction is between the drain 16 and the substrate 12. Above the channel is an oxide-nitride-oxide (ONO) stack 17, comprising a silicon dioxide layer 18, a silicon nitride layer 19 and a silicon dioxide layer 20. Also, a control gate 22 is formed over the ONO stack 17. The silicon dioxide layer 18 forms as an electrical isolation layer over the channel. The silicon nitrite layer 19 functions as a trapping storage layer. The silicon dioxide layer 20 electrically isolates the silicon nitride layer 19 and the control gate 22. The PHINES cell is capable of storing two bits of data, and represented as left-bit (L-bit) and right-bit (R-bit) through FIG. 5A~FIG. 5D. In the PHINES cell, the silicon nitrite layer 19 serves as the memory retention and traps hot holes and hot electrons.

Figure 6:
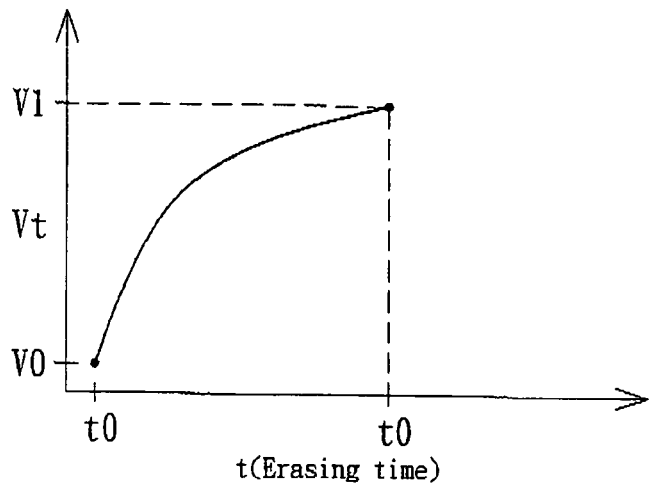
FIG. 6 represents the relationship between threshold voltage and erasing time as step for erasing the PHINES cell is performed.
Figure 5A:
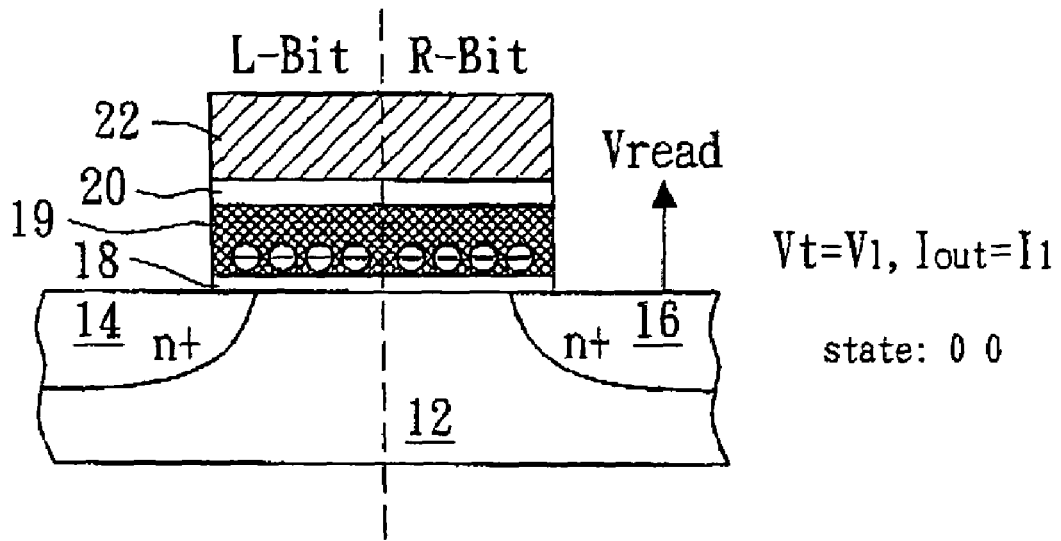
FIG. 5A~FIG. 5D schematically show the state of erasing, programming and reading the PHINES cell and the related logical information of two bits according to the first embodiment of the invention.

As shown in FIG. 5A, the L-Bit and the R-Bit need to be erased by FN electron injection before programming the PHINES cell. For example, in the erasing step, an erase voltage is applied to the control gate 22 while the source 14 and the drain 16 are grounded. If a negative erase voltage is applied, the electrons are injected from the control gate 22 into the silicon nitride layer 19. IF a positive erase voltage is applied, the electrons are injected from the substrate 12 into the silicon nitrite layer 19. During the erasing step, the threshold voltage (Vt) is increased with the erasing time, as shown in FIG. 6. After erase of the L-Bit and the R-Bit is completed, Vt is increased to the highest value V1.

Figure 7:
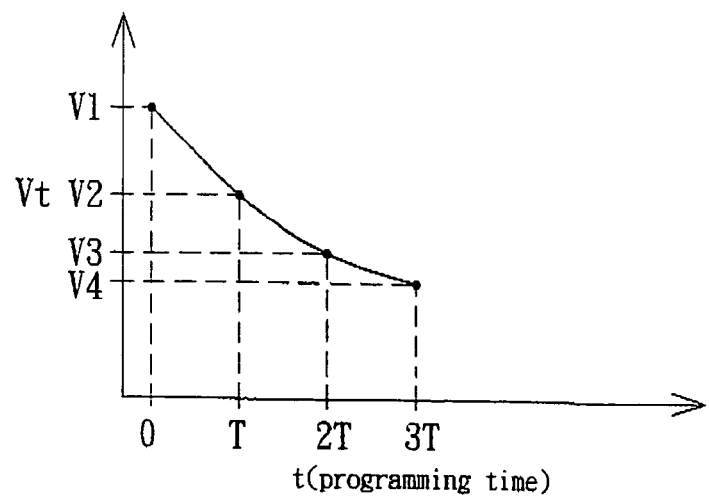
FIG. 7 represents the relationship between threshold voltage and programming time as step for programming the PHINES cell is performed.
Figure 5B:
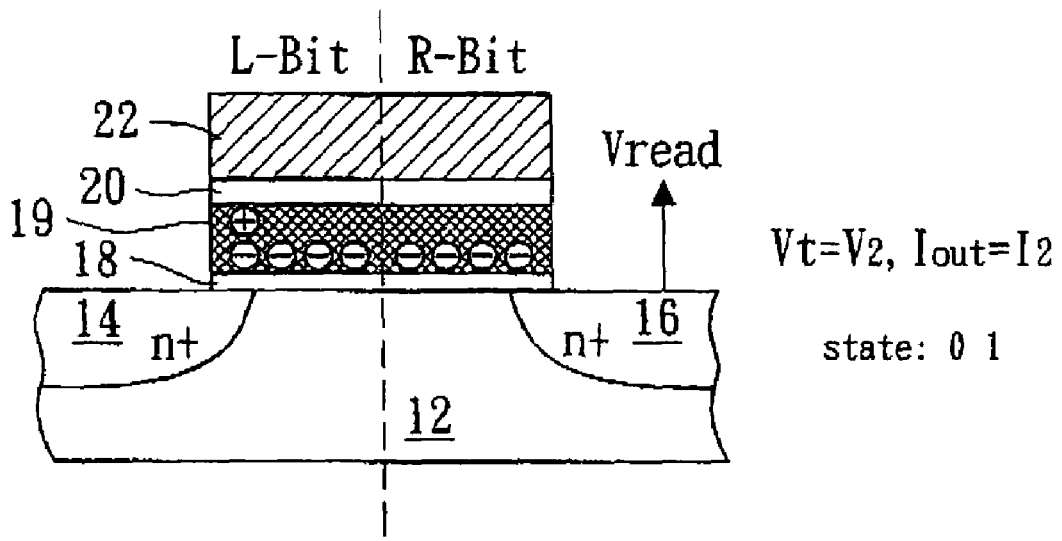
Figure 5C:
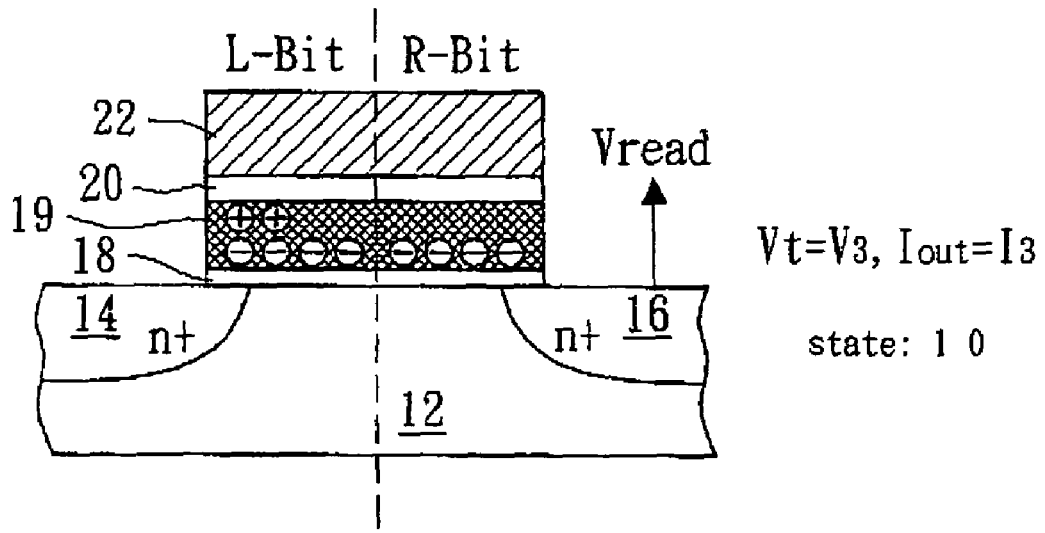
Figure 5D:
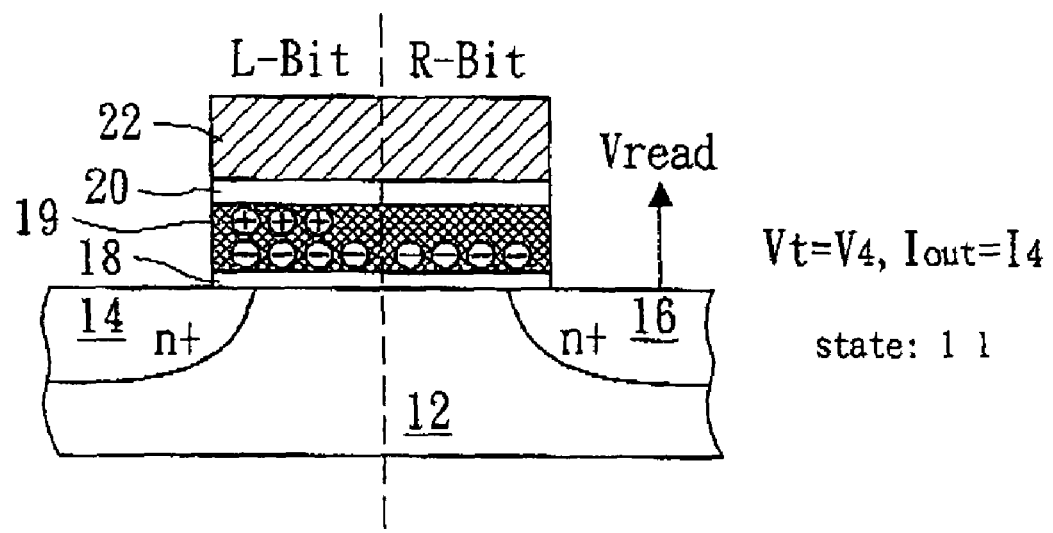

In FIG. 5B~5D, it is assumed that a hot hole is injected through the left PN junction into the silicon nitrite layer 19 of L-Bit. For example, during the programming step, a selected program voltage and a gate voltage are applied to the source 14 and the control gate 22, respectively. Meanwhile, the Vt is decreased with the programming time, as shown in FIG. 7. In FIG. 7, T is pulsewidth in the programming step.

In the present invention, one-side reading scheme is used for identifying the logical information of the PHINE cell. In the first embodiment, it is assumed that a read voltage (Vd) is applied to the drain 16 for reading the logical state of the PHINE cell. Since different quantity of hot hole is stored in the L-Bit and the R-Bit, the interaction of stored charge on two bits generates the different Vt of the PHINES cell. By measuring the output current (Iout) of the drain 16, the logical information of the PHINES cell can be well determined. In FIG. 5A~FIG. 5D, the threshold voltage (Vt) is in an order of V1>V2>V3>V4 (the output current (Iout): I1<I2<I3<I4), the logical information of the PHINES cell can be determined as "0 and 0" (FIG. 5A), "0 and 1" (FIG. 5B), "1 and 0" (FIG. 5C) and "1 and 1" (FIG. 5D) according to the different quantity of output current.

Two-side Hot Hole Programming and One-side Reading Scheme

FIG. 8A~FIG. 8D schematically show the state of erasing, programming and reading the PHINES cell and the related logical information of two bits according to the second embodiment of the invention. It is also assumed that a read voltage is applied to the drain 16 for reading the logical information of the PHINES cell.

Figure 8A:
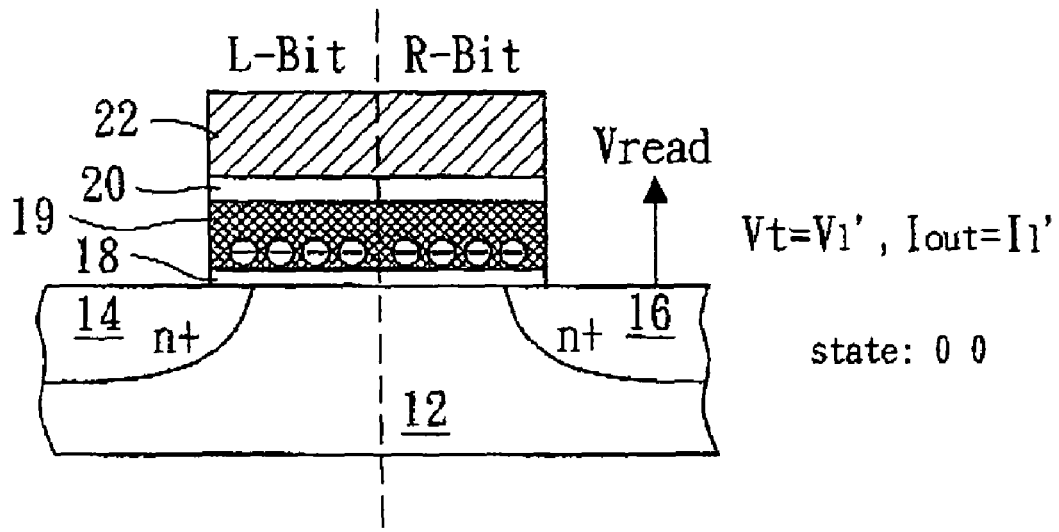
FIG. 8A~FIG. 8D schematically show the state of erasing, programming and reading the PHINES cell and the related logical information of two bits according to the second embodiment of the invention.

In FIG. 8A, the L-Bit and the R-Bit of the PHINES cell are erased before proceeding the programming step. During the erasing step, the threshold voltage (Vt) is increased with the erasing time, and the tendency of the curve (Vt vs. erasing time) is similar as the curve represented in FIG. 6. After erase of the L-Bit and the R-Bit is completed, Vt is increased to the certain value V1.

Figure 8B:
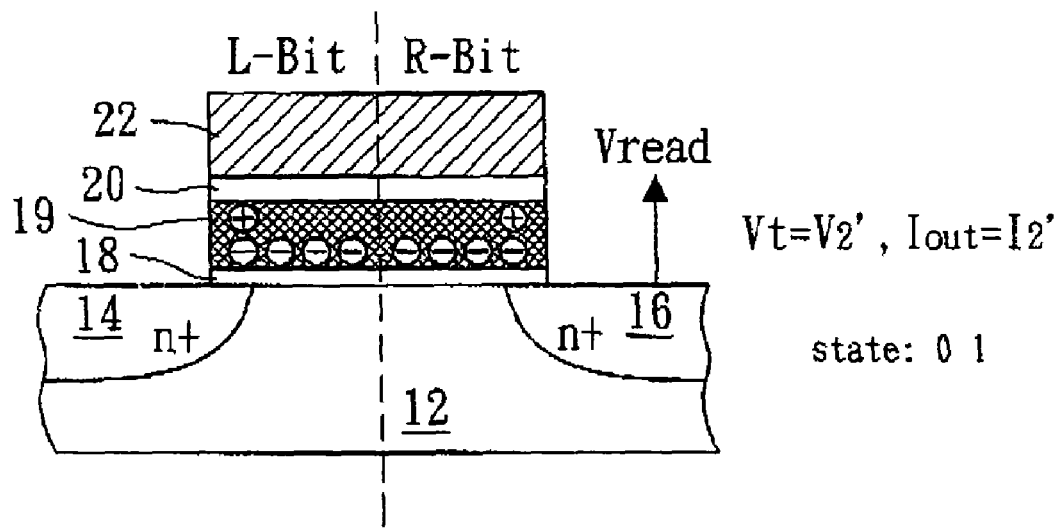
Figure 8C:
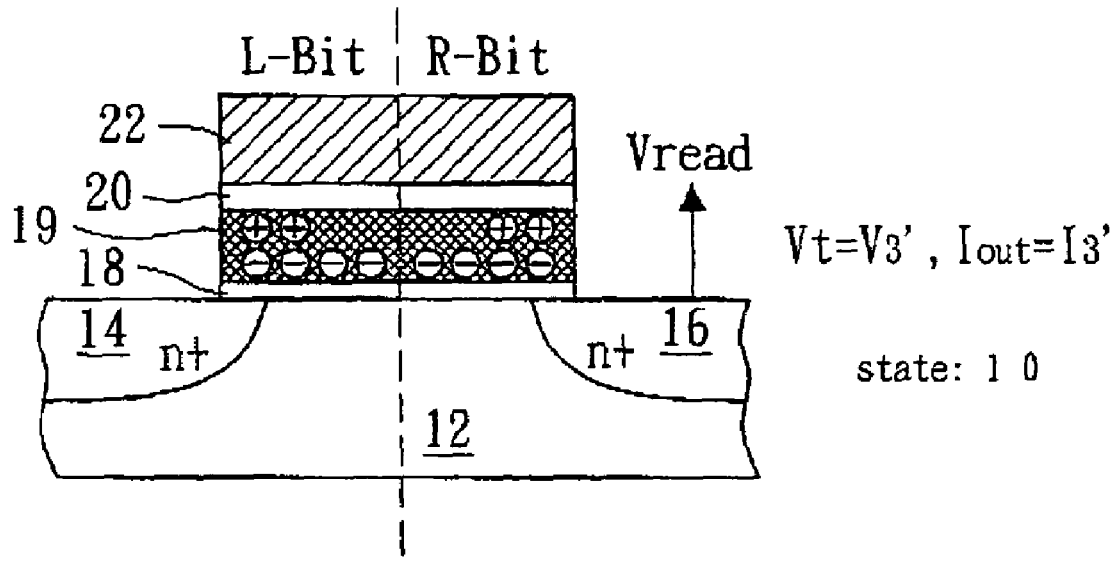
Figure 8D:
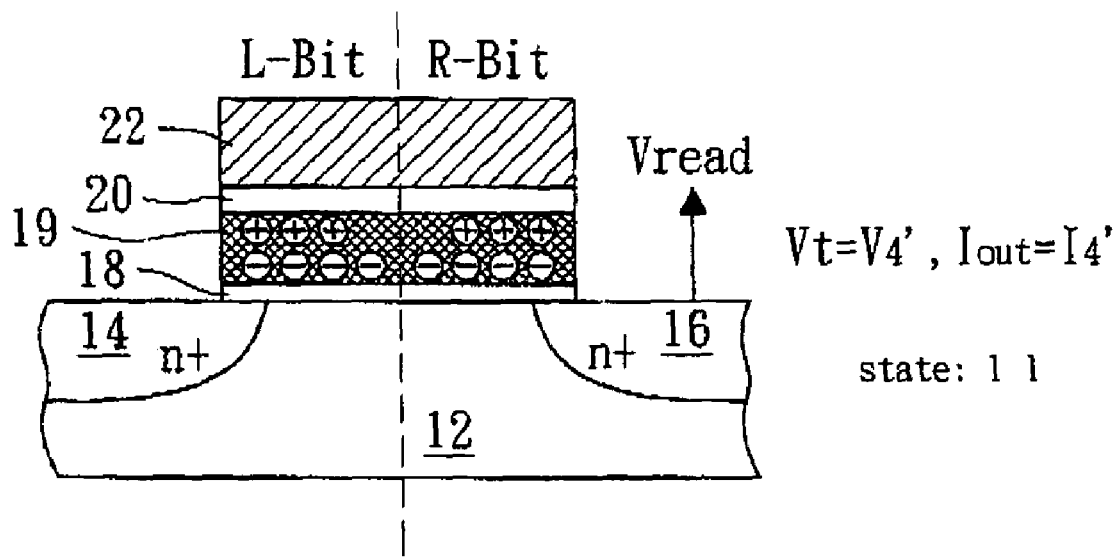

In FIG. 8B~8D, the L-Bit and the R-Bit are programmed by hot hole injection. The Vt is decreased with the programming time.

As shown in FIG. 8B, two hot holes are injected to the silicon nitrite layer 19 of the L-Bit and the R-Bit, respectively. The threshold voltage (Vt) is V2' and the output current (Iout) is I2'.

As shown in FIG. 8C, four hot holes are injected to the silicon nitrite layer 19 of the L-Bit and the R-Bit, respectively. The threshold voltage (Vt) is V3' and the output current (Iout) is I3'.

As shown in FIG. 8D, six hot holes are injected to the silicon nitrite layer 19 of the L-Bit and the R-Bit, respectively. The threshold voltage (Vt) is V4' and the output current (Iout) is I4'.

Due to the interaction of the stored charge on two bits, different Vt is achieved so as to identify the logical information by one-side reading. By measuring the output current (Iout) at one side of the cell, the logical information can be well determined. In FIG. 8A~FIG. 8D, the threshold voltage (Vt) is in an order of V1>V2'>V3'>V4' (the output current (Iout): I1<I2'<I3'<I4'), thereby determining the logical information of the PHINES cell as "0 and 0" (FIG. 8A), "0 and 1" (FIG. 8B), "1 and 0" (FIG. 8C) and "1 and 1" (FIG. 8D).

Unlike reading logical information of the PHINES cell in the reverse direction (described in the Related Art), the read voltage (Vread) selected in the one-side read scheme of the invention is smaller than that in the reverse-read scheme. Also, the selection of Vread in the one-side reading scheme is much flexible than that in the reverse-read scheme. On the other hands, the method of the invention can ease the limitation of $2^{nd}$-bit effect (avoid the requirement of using higher Vread to reduce the interaction of reverse-read method). With the smaller Vread applied in the one-side reading method, the operating life of the PHINES is improved. Furthermore, one-side reading scheme of the invention can ease the limitation of hole-enhance local-DIBL effect and control the operation window.

It is, of course, understood that the method of the invention can be used in the application of MLC (multi-level cell) operation for identifying the logical information of the ML cell. For example, ML PHINES cell can be determined by one-side reading scheme as 8 logical states ("0, 0, 0", "0, 0, 1", "0, 1, 0", "0, 1, 1" "1, 0, 0", "1, 0, 1", "1, 1, 0" and "1, 1, 1") if the cell has three bits per cell, 16 logical states if the cell has four bits per cell, and $2^X$ logical states if the cell has X bits per cell ($X \geq 1$, X is an integer).

Although the PHINES cell is taken for the illustration of the embodiments of the invention, it is, of course, understood that the one-side reading method of the invention can be used in the application of the other cells. Accordingly, the method of identifying logical information in a cell by one-side reading comprises the steps of:

erasing a first region and a second region of the cell (by electron injection/hot hole injection);

programming after erasing at least one of the first region and the second region of the cell (by hole injection/electron injection); and reading a logical state of the cell by measuring an output current of one of the first region and the second region by measuring an output current of one of the first region and the second region; wherein different quantity of the output current is caused by interaction between different quantity of charges stored in the first region and the second region, and the logical state of the cell is therefore determined by one-side reading scheme.

While the invention has been described by way of examples and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of operating a memory cell, the memory cell having a first region and a second region with a channel therebetween and having a gate above the channel but separate therefrom by a dielectric layer comprising charge-trapping material, said method comprising:

introducing a first predetermined amount of charges into the first region and a second predetermined amount of charges into the second region to cause a threshold voltage (Vt) of said memory cell;

sensing said threshold voltage of said memory cell from a side of said memory cell near to said first region; and determining a combination of logical states of said memory cell according to the measured threshold voltage of said memory cell by sensing the same side near to said first region.

2. The method according to claim 1, further comprises introducing electrons to both of the first region and the second region.

3. The method according to claim 2, wherein the electrons are introduced to both of the first region and the second region before the first and second predetermined amounts of charges are respectively introduced into the first and second regions.

4. The method according to claim 3, wherein the first and second predetermined amounts of charges are respectively introduced into the first and second regions by hot hole injection.

5. The method according to claim 3, wherein in the step of introducing electrons to both of the first and second regions, the threshold voltage is increased to a highest value when the electrons are completely introduced to both of the first region and the second region.

6. The method according to claim 5, wherein the threshold voltage is decreased from the highest value to a certain value while the first and second predetermined amounts of charges are introduced into the respective first and second regions.

7. The method according to claim 2, wherein the electrons are introduced into the first and second regions by FN electron injection technique.

8. The method according to claim 1, wherein the combination of logical states of the memory cell is determined by applying a gate voltage to the gate and a reading voltage to the first region.

9. The method according to claim 1, wherein the combination of logical states of the memory cell is determined by applying a gate voltage to the gate and a reading voltage to the second region.

10. The method according to claim 1, wherein the combination of logical states of the memory cell can be determined as "0 and 0", "0 and 1", "1 and 0" and "1 and 1".

11. The method according to claim 2, wherein the step of introducing electrons to both of the first region and the second region is conducted by erasing both of the first and the second regions.

* * * * *